(12) United States Patent
Alameh et al.

(10) Patent No.: US 11,900,784 B2
(45) Date of Patent: Feb. 13, 2024

(54) ELECTRONIC DEVICE HAVING CAPACITANCE-BASED FORCE SENSING

(71) Applicant: MOTOROLA MOBILITY LLC, Chicago, IL (US)

(72) Inventors: Rachid Alameh, Crystal Lake, IL (US); Yi Wu, Chicago, IL (US); James P. Ashley, Naperville, IL (US); Zhengping Ji, Hinsdale, IL (US)

(73) Assignee: Motorola Mobility LLC, Chicago, IL (US)

( * ) Notice: Subject to any disclaimer, the term of this patent is extended or adjusted under 35 U.S.C. 154(b) by 239 days.

(21) Appl. No.: 16/883,202

(22) Filed: May 26, 2020

(65) Prior Publication Data

US 2021/0375114 A1    Dec. 2, 2021

(51) Int. Cl.
*G08B 21/18* (2006.01)
*H05K 5/03* (2006.01)
*A63F 13/214* (2014.01)
*G06F 3/044* (2006.01)
*H05K 5/00* (2006.01)

(52) U.S. Cl.
CPC .......... *G08B 21/182* (2013.01); *A63F 13/214* (2014.09); *G06F 3/044* (2013.01); *H05K 5/0017* (2013.01); *H05K 5/03* (2013.01)

(58) Field of Classification Search
CPC .... G08B 21/182; A63F 13/214; A63F 13/218; A63F 13/24; G06F 3/044; G06F 3/04144; G06F 3/0447; H05K 5/0017; H05K 5/03
See application file for complete search history.

(56) References Cited

U.S. PATENT DOCUMENTS

| 10,962,809 | B1  | 3/2021  | Castañeda |
|---|---|---|---|
| 2007/0242037 | A1* | 10/2007 | Son ....................... G06F 3/0445 345/156 |
| 2008/0088596 | A1  | 4/2008  | Prest et al. |
| 2011/0141052 | A1* | 6/2011  | Bernstein ................ G06F 3/041 341/5 |
| 2013/0199908 | A1  | 8/2013  | Ladouceur et al. |

(Continued)

OTHER PUBLICATIONS

Bekhti, Richid et al., Miniature Capacitive Three-Axis Force Sensor, IEEE/RSJ International Conference on Intelligent Robots and Systems (IROS 2014) pp. -8.

(Continued)

*Primary Examiner* — James J Yang
(74) *Attorney, Agent, or Firm* — Isidore PLLC

(57) ABSTRACT

An electronic device has pair(s) of conductive plates that is coupled to a housing and is electrically isolated by a dielectric material. The pair(s) of conductive plates is positioned to change relative orientation in relation to mechanical force that deforms the housing. Capacitive driver(s) is electrically coupled to pair(s) of conductive plates. A controller is communicatively coupled to the capacitive driver(s). The controller identifies a first capacitance of the pair(s) of conductive plates associated with the housing being in a normal state. The controller detects, via the capacitor driver(s), a change in capacitance from the first capacitance to a second capacitance of the pair(s) of conductive plates. The controller compares the change in capacitance to a threshold. In response to the change exceeding the threshold, the controller generates a notification.

20 Claims, 12 Drawing Sheets

(56) References Cited

U.S. PATENT DOCUMENTS

| | | |
|---|---|---|
| 2014/0002417 A1 | 1/2014 | Yoshida |
| 2014/0071077 A1* | 3/2014 | Kang .................... G06F 3/0488 |
| | | 345/173 |
| 2016/0291731 A1* | 10/2016 | Liu ..................... G06F 3/04883 |
| 2017/0033797 A1 | 2/2017 | Jung et al. |
| 2017/0090667 A1 | 3/2017 | Abdollahian et al. |
| 2018/0067600 A1 | 3/2018 | Li et al. |
| 2019/0138107 A1* | 5/2019 | Nietfeld ................ G06F 3/0346 |

OTHER PUBLICATIONS

Notice of Allowance dated Jun. 26, 2023, issued in related U.S. Appl. No. 16/883,264 (11 pages).

* cited by examiner

ELECTRONIC DEVICE HAVING CAPACITANCE-BASED FORCE SENSING

1. TECHNICAL FIELD

The present disclosure relates generally to electronic devices that utilize force sensors, and more particularly to electronic devices that utilize capacitive-based force sensors.

2. DESCRIPTION OF THE RELATED ART

Generally-known electronic devices have mechanical or electrical sensors for receiving user inputs. Controls such as push buttons, keys, or touch screens require a degree of manual dexterity to use. Certain types of controls further require that a user have clean skin contact for capacitive-based interaction with the control. Even if convenient for a user to manually trigger the control, the type of input motion required to interact with the control is limited. The input motion may not be intuitively related to the user input desired. For example, a motorcycle racing game can include adjusting a throttle and a brake handle. Pressing one of two buttons can be unsatisfactory to a user in emulating these controls.

To enhance mobility, many types of electronic devices are designed with a small form factor. For example, smart phones are often small and thin to be inconspicuously stored and easy to hold. Reductions in size of electronic devices results in concerns about forces applied to a housing of the electronic devices. These forces can be volitional or inadvertent. The small/thin size of the electronic device limits structural strength and integrity of the housing of such electronic devices. Mechanical forces placed on the housing can result in damage to the electronic device.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
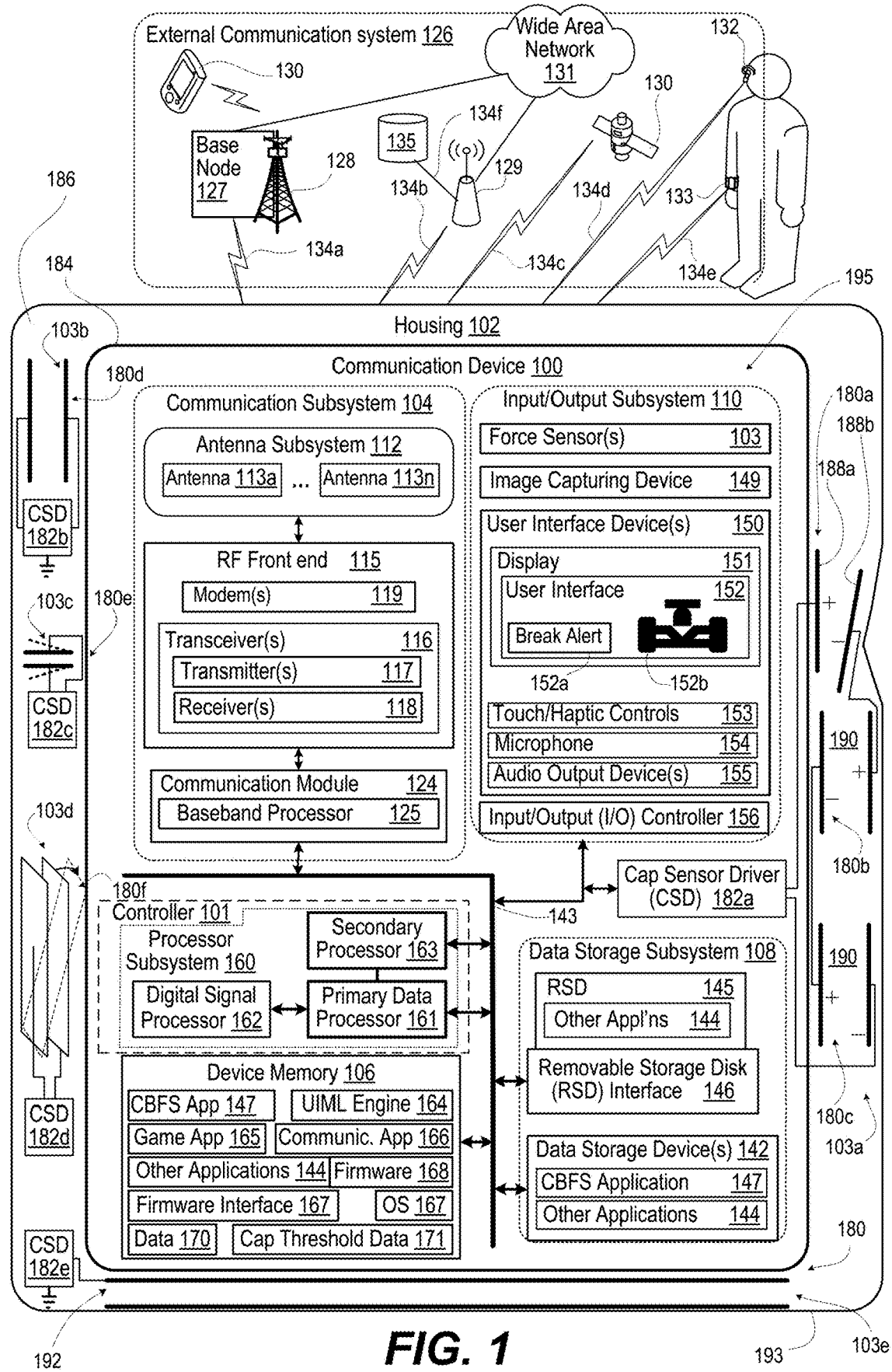
FIG. 1 is a functional block diagram of an electronic device that operates as a communication device in a communication environment and within which the features of the present disclosure are advantageously implemented, according to one or more embodiments.

According to aspects of the present disclosure, an electronic device, a method, and a computer program product provide capacitive-based force sensing of mechanical force(s) exerted on a housing of the electronic device. The electronic device has at least one pair of conductive plates that is coupled to a housing and is electrically isolated by a dielectric material. The pair(s) of conductive plates are positioned to change relative orientation in relation to a mechanical force that deforms the housing. At least one capacitor driver is electrically coupled to one or more of the at least one pair of conductive plates. A controller is communicatively coupled to each of the at least one capacitor driver(s). The controller identifies a capacitance of each pair of conductive plates associated with the housing being in a normal state. The controller detects, via the capacitive driver(s), a change in capacitance from the first capacitance to a second capacitance of each of the at least one pair of conductive plates. The controller compares the change in capacitance to a threshold. In response to the change exceeding the threshold, the controller generates a notification.

In a particular aspect of the present disclosure, incorporating force sensing into a housing is expanded to include sensing unaligned forces at multiple locations on the housing. The nature of the force can encompass one or more of compression, tension, twisting, bending and shearing. The force can originate volitionally by a user. For example, a person with limited finger dexterity can manipulate the housing to create a user input. As another example, the manipulation of the housing can better mimic a real world analogue, such as twisting a motor throttle, as compared to a button push. The force can be inadvertently applied, such as when the device is placed in a rear pant pocket and sat on. The electronic device can protect itself when a potentially damaging force is detected and generate a notification to avert the damage.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention. The description of the illustrative embodiments can be read in conjunction with the accompanying figures. Embodiments incorporating teachings of the present disclosure are shown and described with respect to the figures presented herein.

FIG. 1 is a functional block diagram of an electronic device in an operating environment within which the features of the present disclosure are advantageously implemented. In particular, the electronic device is presented as communication device 100, which is managed by controller 101. According to one aspect, communication device 100 is a mobile or hand-held device. While presented as communication device 100 it is appreciated that the features describe herein are fully applicable to other types of electronic devices, and that the presentation of communication device 100 is solely as an example and not meant to be limiting on the disclosure. Communication device 100 can be one of a host of different types of devices, including but not limited to, a mobile cellular phone, satellite phone, or smart-phone, a laptop, a net-book, an ultra-book, a networked smart watch or networked sports/exercise watch, and/or a tablet computing device or similar device that can include wireless communication functionality. As a device supporting wireless communication, communication device 100 can be utilized as, and also be referred to as, a system, device, subscriber unit, subscriber station, mobile station (MS), mobile, mobile device, remote station, remote terminal, user terminal, terminal, user agent, user device, a Session Initiation Protocol (SIP) phone, a wireless local loop (WLL) station, a personal digital assistant (PDA), computer workstation, a handheld device having wireless connection capability, a computing device, or other processing devices connected to a wireless modem.

Referring now to the specific component makeup and the associated functionality of the presented components. Communication device 100 includes housing 102. Housing 102 is deformable in response to an externally applied mechanical force. Force sensors 103 are incorporated into housing 102 to detect deformation of housing 102. In one or more embodiments, communication device 100 includes communication subsystem 104, device memory 106, data storage subsystem 108, and input/output (I/O) subsystem 110. Each subsystem (104, 108, and 110) is managed by controller 101. Communication subsystem 104 includes antenna subsystem 112, which is comprised of antennas 113a-113n. Communication subsystem 104 also includes RF front end 115 having transceiver(s) 116 that has transmitter(s) 117 and receiver(s) 118. RF front end 115 further includes modem(s) 119. Communication subsystem 104 includes communication module 124 having baseband processor 125. Baseband processor 125 communicates with controller 101 and RF front end 115. Baseband processor 125 operates in baseband frequency range to encode data for transmission and decode received data, according to a communication protocol. Modem(s) 119 modulate baseband encoded data from communication module 124 onto a carrier signal to provide a transmit signal that is amplified by transmitter(s) 117. Modem(s) 119 demodulates each signal received from external communication system 126 detected by antenna subsystem 112. The received signal is amplified and filtered by receiver(s) 118, which demodulate received encoded data from a received carrier signal.

In one or more embodiments, controller 101, via communication subsystem 104, performs multiple types of over-the-air (OTA) or wireless communication with external communication system 126. External communication system 126 can include devices such as base node(s) 127 elevated on respective radio tower(s) 128, access node(s) 129, and global positioning system (GPS) satellites 130. Some of these devices can be communicatively coupled to at least one wide area network 131. In one or more embodiments, external communication system 126 includes wireless headset 132 and smart watch 133 that are coupled to communication device 100 to form a personal access network (PAN). Communication subsystem 104 communicates via OTA communication channel(s) 134a with base node 127. Communication subsystem 104 communicates via wireless communication channel(s) 134b with access node 129. In one or more particular embodiments, access node 129 supports communication using one or more IEEE 802.11 wireless local area network (WLAN) protocols. Access node 129 is connected to wide area network 131, such as the Internet. Communication subsystem 104 receives downlink broadcast channel(s) 134c from GPS satellites 130 to obtain geospatial location information. Communication subsystem 104 communicates via low power wireless communication channel(s) 134d with headset 132. Communication subsystem 104 communicates via second low power wireless communication channel(s) 134e, such as Bluetooth, with smart watch 133. In one or more particular embodiments, communication subsystem 104 communicates with one or more locally networked devices 135 via wired or wireless link 134f provided by access node 129.

Data storage subsystem 108 of communication device 100 includes data storage device(s) 142. Controller 101 is communicatively connected, via system interlink 143, to data storage device(s) 142. Data storage subsystem 108 provides nonvolatile storage that is accessible by controller 101. For example, data storage subsystem 108 can provide a selection of other applications 144 that can be loaded into device memory 106. In one or more embodiments, data storage device(s) 142 can include hard disk drives (HDDs), optical disk drives, and/or solid state drives (SSDs), etc. Data storage subsystem 108 of communication device 100 can include removable storage device(s) (RSD(s)) 145, which is received in RSD interface 146. Controller 101 is communicatively connected to RSD 145, via system interlink 143 and RSD interface 146. In one or more embodiments, RSD 145 is a non-transitory computer program product or computer readable storage device. Controller 101 can access RSD 145 to provision communication device 100 with program code, such as capacitive-based force sensing (CBFS) application 147 and other applications 144. When executed by controller 101, the program code causes or configures communication device 100 to provide the functionality described herein.

I/O subsystem 110 includes force sensor(s) 103 and image capturing device 149. I/O subsystem 110 also includes user interface device(s) 150 having one or more of displays 151 that present user interface (UI) 152, touch/haptic controls 153, microphone 154, and audio output device(s) 155. I/O subsystem 110 also includes I/O controller 156, which connects to devices internal and external to housing 102 of communication device 100. Information based on force sensor(s) 103 can be used to generate UI presentation elements, such as break alert 152a and kinematic controlled game representation 152b.

Controller 101 includes processor subsystem 160, which includes one or more central processing units (CPUs), depicted as primary data processor 161. Processor subsystem 160 can include one or more digital signal processors 162 that are integrated with primary data processor 161 or are communicatively coupled to primary data processor 161. In one or more embodiments, processor subsystem 160 further divides data processing tasks between primary data processor 161 and one or more secondary processors 163 that are managed by primary data processor 161. For example, secondary processors 163 can manage force sensor(s) 103. In one or embodiments that are not depicted, controller 101 can further include distributed processing and control components that are peripheral or grouped with other components, such as I/O subsystem 110. Primary data processor 161 is communicatively coupled, via system interlink 143, to device memory 106. In one or more embodiments, controller 101 of communication device 100 is communicatively coupled via system interlink 143 to communication subsystem 104, data storage subsystem 108, and input/output subsystem 110. System interlink 143 represents internal components that facilitate internal communication by way of one or more shared or dedicated internal communication links, such as internal serial or parallel buses. As utilized herein, the term "communicatively coupled" means that information signals are transmissible through various interconnections, including wired and/or wireless links, between the components. The interconnections between the components can be direct interconnections that include conductive transmission media or may be indirect interconnections that include one or more intermediate electrical components. Although certain direct interconnections (interlink 143) are illustrated in FIG. 1, it is to be understood that more, fewer, or different interconnections may be present in other embodiments.

Controller 101 manages, and in some instances directly controls, the various functions and/or operations of communication device 100. These functions and/or operations include, but are not limited to including, application data processing, communication with other electronic devices, navigation tasks, and signal processing. In one or more alternate embodiments, communication device 100 may use hardware component equivalents for application data processing and signal processing. For example, communication device 100 may use special purpose hardware, dedicated processors, general purpose computers, microprocessor-based computers, micro-controllers, optical computers, analog computers, dedicated processors and/or dedicated hardwired logic.

Device memory 106 includes applications such as CBFS application 147, user interface machine learning (UIML) engine 164, game application 165, communication application 166, and other application(s) 144. Device memory 106 further includes operating system (OS) 167, firmware interface 168, such as basic input/output system (BIOS) or Uniform Extensible Firmware Interface (UEFI), and firmware 169. Device memory 106 includes data 170 used by CBFS application 147 and other application(s) 144. Additionally, device memory 106 includes capacitance threshold data 171 used by CBFS application 147. Processor subsystem 160 of controller 101 executes program code to provide operating functionality of communication device 100. These software and/or firmware modules have varying functionality when their corresponding program code is executed by processor subsystem 160 or secondary processing devices within communication device 100. Processor subsystem 160 of controller 101 can execute program code of CBFS application 147 to measure force applied to housing 102 based on changes in capacitance in force sensor(s) 103.

For clarity, force sensor(s) 103 are collectively and functionally depicted as being within I/O subsystem 110. Individual force sensors 103*a*-103*e* are also physically depicted in different configurations and physical orientations and are coupled to housing 102. Each force sensor 103*a*-103*e* (103) includes at least one capacitor 180 electrically coupled to at least one capacitor driver 182*a*-182*e*, which are generally referred to as capacitors 180. For each force sensor 103*a*-103*e*, capacitors 180 are incorporated in housing 102 and are positioned to deform in relation to deformation of housing 102. Housing 102 can include one or more metallic, ceramic, resin, polymer, or other materials that deform under a certain amount of force, without damage. Housing 102 returns to an original relaxed, normal state when the force is removed. In one or more embodiments, housing 102 includes frame 184 to which functional components 185 of communication device 100 are attached. Housing 102 can enclose at least a portion of functional components 185. In one or more embodiments, housing 102 includes or wholly comprises cover 186 that can be engaged or attached to communication device 100. Each capacitor 180 includes paired conductive plates 188*a*-188*b* coupled to housing 102 and electrically isolated by dielectric material 190. Dielectric material 190 is an electrical insulator that can be polarized by an applied electric field. In one or more embodiments, the dielectric material 190 can be, or at least include, air spaces between paired conductive plates 188*a*-188*b*. Controller 101 manages capacitor drivers 182*a*-182*e* of respective force sensors 103*a*-103*e*. Each capacitor driver 182*a*-182*e* polarizes the dielectric material 190 to measure capacitance of one or more paired conductive plates 188*a*-188*b* of respective force sensors 103*a*-103*e*. Controller 101 monitors for changes in capacitance caused by relative changes in position of one conductive plate 188*a* relative to the other conductive plate 188*b* that are caused by a change in housing 102 from a relaxed, normal state to a deformed state. For clarity, "a" suffix of conductive plate 188*a* can be associated with a positive terminal of the capacitor 180 and "b" suffix of conductive plate 188*b* can be associated with a negative terminal of capacitor 180.

The number and orientation of force sensors 103*a*-103*e* are illustrative of certain aspects of the present disclosure and are not intended to be all inclusive or all necessary. Force sensor 103*a* includes capacitor driver 182*a* that is electrically coupled across a series of three capacitors 180*a* 180*c*. Parallel connection (not depicted) is electrically connecting positive terminals (conductive plates 188*a*) of more than one capacitor 180 and electrically connecting negative terminals (conductive plates 188*b*) of the more than one capacitor 180. As depicted, series connection is chaining the more than one capacitor 180 *a* 180*c* together. As depicted, a positive conductor of capacitor driver 182 is electrically coupled to positive terminal (conductive plate 188*a*) of capacitor 180*a*. Negative terminal (conductive plate 188*b*) of capacitor 180*a* is electrically coupled to positive terminal (conductive plate 188*a*) of capacitor 180*b*. Negative terminal (conductive plate 188*b*) of capacitor 180*b* is electrically coupled to positive terminal (conductive plate 188*a*) of capacitor 180*c*. Negative terminal (conductive plate 188*b*) of capacitor 180*c* is electrically coupled to negative conductor of capacitor driver 182*a*. Capacitors 180*a* 180*c* of force sensor 103*a* are incorporated along, and aligned in parallel with, a right side of housing 102, as depicted. Deformation that affects any of three capacitors 180*a* 180*c* is detectable via capacitor driver 182*a*, although the collective change in capacitance does not indicate which capacitors 180*a* 180*c* are affected.

Force sensor 103*b* includes capacitor driver 182*b* that is electrically coupled to one capacitor 180*d* having paired conductive plates 188*a*-188*b* that are incorporated along, and aligned in parallel with, a left side of housing 102 as depicted. Deformation that affects capacitor 180*d* is detectable via capacitor driver 182*b*, identifying a specific location of the specific capacitor 180*d* that is affected. Force sensor 103*b* monitors a smaller longitudinal length of housing 102 than force sensor 103*a*. Force sensor 103*c* includes capacitor driver 182*c* that is electrically coupled to one capacitor 180*e* having paired conductive plates 188*a*-188*b* that are incorporated along, and aligned perpendicular to, the left side of housing 102. Deformation that affects capacitor 180*e* is detectable via capacitor driver 182*c*, identifying a specific location of the specific capacitor 180 that is affected. Force sensor 103*c* monitors a force that is not aligned with a force sensed by force sensor 103*b*. Force sensor 103*d* includes capacitor driver 182*d* that is electrically coupled to one capacitor 180*f* having paired conductive plates 188*a*-188*b* that are incorporated along, and aligned parallel to, the left side of housing 102. Deformation that affects capacitor 180*f* is detectable via capacitor driver 182*d*, identifying a specific location of the specific capacitor 180*f* that is affected. Force sensor 103*d* monitors a force that is not aligned with a force sensed by force sensor 103*c*. Force sensor 103*e* includes capacitor driver 182*e* that is electrically coupled to one capacitor 180*g* having paired conductive plates 188*a*-188*b* that are incorporated along, and aligned parallel to, a bottom side of housing 102. Deformation that affects capacitor 180g is detectable via capacitor driver 182e. Force sensor 103e monitors a force that is not necessarily aligned with a force sensed by other force sensors 103a-103d. In one or more embodiments, paired conductive plates are one of: (i) embedded within housing 102; (ii) located outside of housing within dialectic material 190 that comprises a protective layer (cover 186); and (iii) positioned with each plate on opposite sides of air space 192 with housing 102 comprising housing skin 193 and housing frame 184 that respectively define an exterior side and an interior side of the air space.

Figure 2:
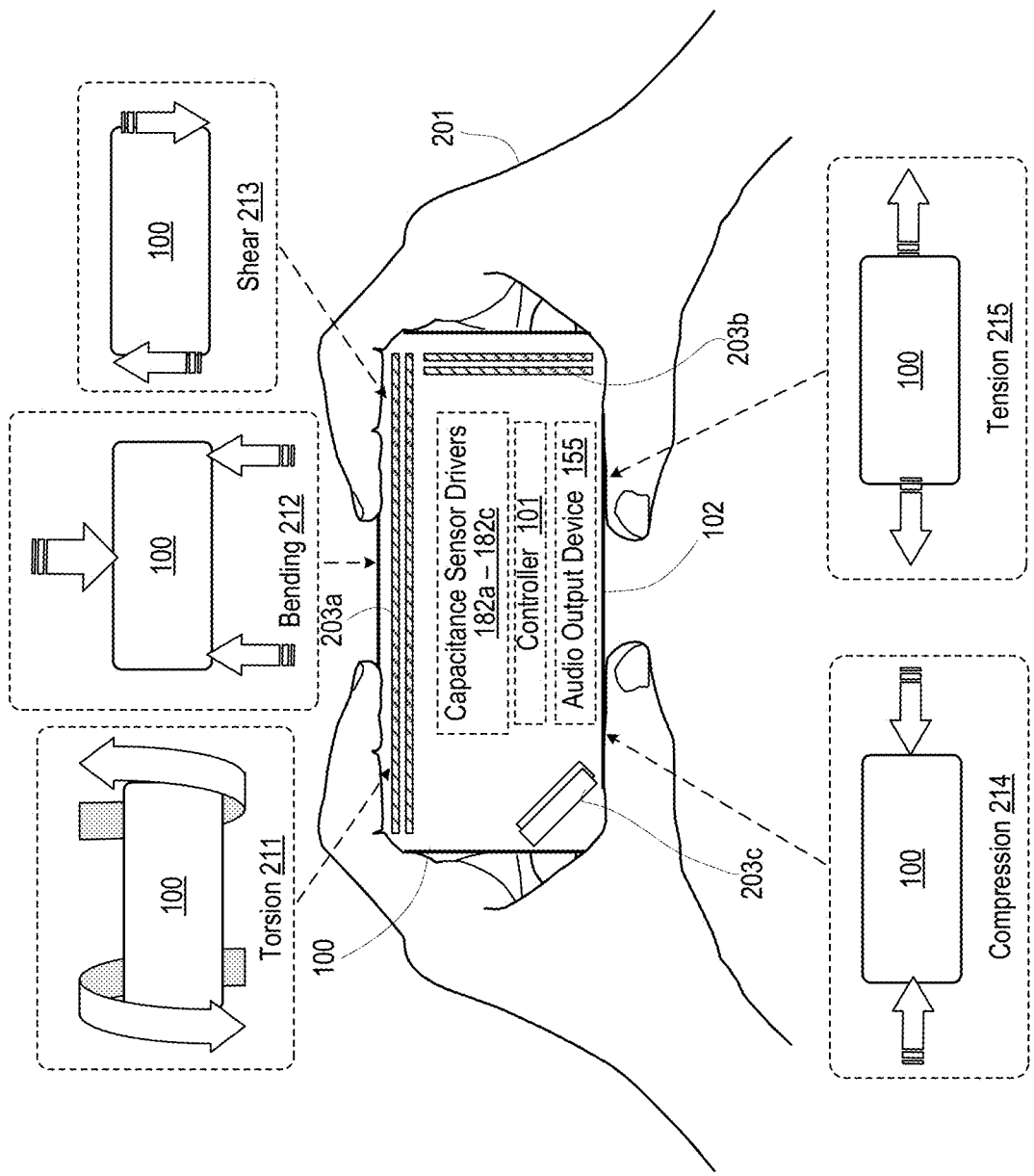
FIG. 2 depicts a front view of the communication device of FIG. 1 being manipulated by a user who exerts one or more different types of mechanical force on the communication device, according to one or more embodiments.

FIG. 2 depicts a front view of communication device 100 being manipulated by user 201 who exerts a mechanical force on housing 102. Longitudinal force sensor 203a is positioned to detect forces that deform long axis of housing 102. Lateral force sensor 203b is positioned to detect forces that deform a shorter, lateral axis of housing 102. Angled force sensor 203c is transverse to both longitudinal and lateral axes of communication device 100 and can detect a force on a corner of housing 102. In one or more embodiments, force sensors 203a-203c are monitored singularly and in combination to detect mechanical forces of torsion 211, bending 212, shearing 213, compression 214, and tension 215. Additional force sensors (not depicted) can provide granular sensing of the location of one or more concurrent forces on housing 102.

Figures 3A, 3B, 3C:
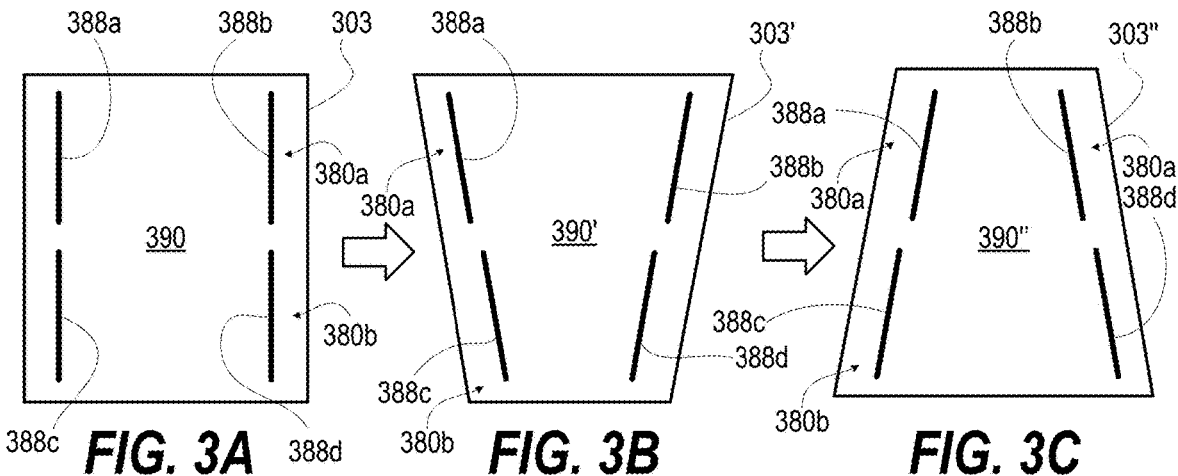
FIG. 3A is a side view of a force sensor of the communication device of FIG. 1 having two capacitors that are in planar alignment in a relaxed, normal state, according to one or more embodiments.
FIG. 3B is a side view of the force sensor of FIG. 3A having the two capacitors in a first deformed state of bending, according to one or more embodiments.
FIG. 3C is a side view of the force sensor of FIG. 3A having the two capacitors in a second deformed state of bending that is opposite to the first deformed state, according to one or more embodiments.

FIG. 3A is a side view of force sensor 303 of communication device 100 in a relaxed, normal state, according to one or more embodiments. Force sensor 303 includes upper capacitor 380a having upper paired conductive plates 388a-388b. Conductive plates 388a-388b are parallel and have respective inward faces aligned to maximize a common area that contributes to capacitance of upper capacitor 380a. Conductive plates 388a-388b are each perpendicular to a closest upper rectilinear face of housing 102. Force sensor 303 includes lower capacitor 380b having lower paired conductive plates 388c-388d. Conductive plates 388c-388d are parallel and have respective inward faces aligned. Conductive plates 388c-388d are each perpendicular to a closest lower rectilinear face of housing 102. Upper and lower paired conductive plates 388c-388d are respectively equally spaced by dielectric material 590. Capacitance (C) between the plates is defined by the equation:

$$C = \epsilon_r \epsilon_0 \frac{A}{d} \qquad \text{Eqn. 1}$$

where A is the area of the conductive plates, d is distance between plates, c represents the absolute permittivity of the dielectric material being used, $\epsilon_r$ is relative permittivity or dielectric between the plates, and $\epsilon_o$ is the permittivity of a vacuum/free space that has the value of the constant $8.84 \times 10^{-12}$ Farads per meter.

FIG. 3B is a side view of force sensor 303' with upper and lower capacitors 380a-380b in a first deformed state of bending. Upper paired conductive plates 388a-388b move farther apart, reducing capacitance of upper capacitor 380a. Lower paired conductive plates 388a-388b move closer together, increasing capacitance of lower capacitor 380b. The changes in capacitance indicates the direction and magnitude of bending.

FIG. 3C is a side view of force sensor 303" with upper and lower capacitors 380a-380b in a second deformed state of bending. In the second deformed state, upper paired conductive plates 388a-388b move closer together, increasing capacitance of upper capacitor 380a. Inversely, in the second deformed state, lower paired conductive plates 388a-388b move farther apart, decreasing capacitance of lower capacitor 380b. The changes in capacitance indicates the opposite direction as well as the magnitude of bending of the plates.

Figures 4A, 4B, 4C:
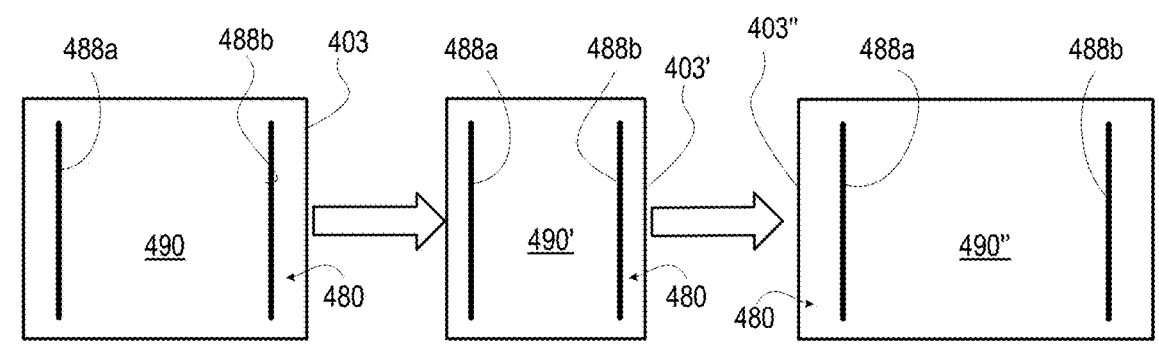
FIG. 4A is a side view of a force sensor of the communication device of FIG. 1 in a relaxed, normal state, according to one or more embodiments.
FIG. 4B is a side view of a force sensor of the communication device of FIG. 4A in a third deformed state of compression, according to one or more embodiments.
FIG. 4C is a side view of a force sensor of the communication device of FIG. 4A in a fourth deformed state of tension, according to one or more embodiments.

FIG. 4A is a side view of force sensor 403 of communication device 100 in a relaxed, normal state. Force sensor 403 includes capacitor 480 having paired conductive plates 488a-488b that are parallel and have respective inward faces aligned. FIG. 4B is a side view of force sensor 403' in a third deformed state of compression. Paired conductive plates 488a-488b move closer together, increasing capacitance of capacitor 480. FIG. 4C is a side view of force sensor 403" in a fourth deformed state of tension. Paired conductive plates 488a-488b move farther apart, decreasing capacitance of capacitor 480.

Figures 5A, 5B, 5C:
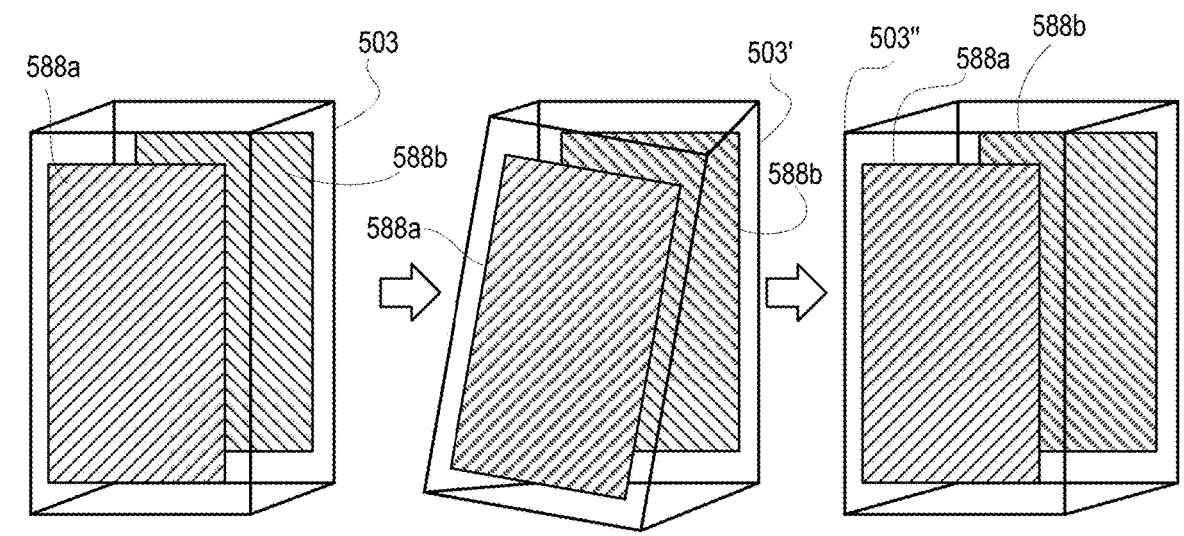
FIG. 5A is a three-dimensional view of a force sensor of the communication device of FIG. 1 in a relaxed, normal state, according to one or more embodiments.
FIG. 5B is a three-dimensional view of the force sensor of FIG. 5A in a fifth deformed state of twisting, according to one or more embodiments.
FIG. 5C is a three-dimensional view of the force sensor of FIG. 5A in a sixth deformed state of shearing, according to one or more embodiments.

FIG. 5A is a three-dimensional view of force sensor 503 of communication device 100 in a relaxed, normal state. Force sensor 503 includes capacitor 580 having paired conductive plates 588a-588b that are parallel and have respective inward faces aligned. FIG. 5B is a three-dimensional view of the force sensor of FIG. 5A in a fifth deformed state of twisting. Paired conductive plates 588a-588b remain at an unchanged distance. One conductive plate 588a is rotated relative to the other conductive plate 588b, moving a portion of the common area out of correspondence, reducing the capacitance. FIG. 5C is a three-dimensional view of force sensor 503" in a sixth deformed state of shearing. Paired conductive plates 588a-588b remain at an unchanged distance. One conductive plate 588a is laterally shifted relative to the other conductive plate 588b. The inward faces of conductive plates 588a-588b are no longer wholly aligned. The portion of faces of conductive plates 588a-588b that are proximate to each other ("common area") is reduced. This shift moves a portion of the common area out of correspondence, thus reducing the capacitance.

Figure 6A:
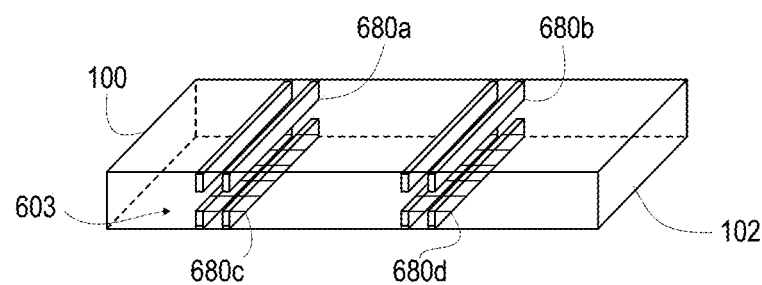
FIG. 6A is a three-dimensional view of an example communication device with a force sensor having two full-length capacitors across a top area of a housing and respectively aligned with two full-length capacitors across a bottom area of the housing, according to one or more embodiments.
Figure 6B:
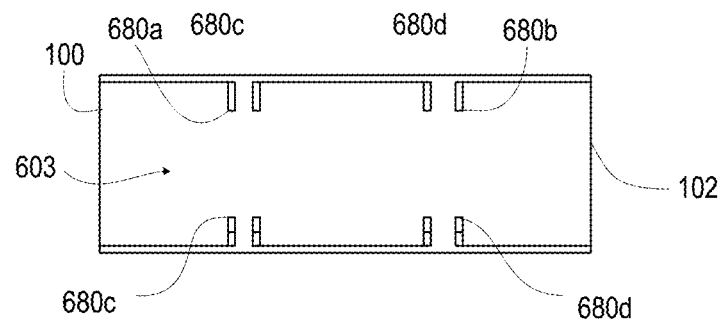
FIG. 6B is a side view of the example communication device of FIG. 6A, according to one or more embodiments.

FIG. 6A is a three-dimensional view of example communication device 100 with force sensor 603 having two full-length capacitors 680a-680b across a top area of housing 102. The two full-length capacitors 680a-680b are respectively aligned with two full-length capacitors 680c-680d across a bottom area of housing 102. FIG. 6B is a side view of example communication device 100 of FIG. 6A. Each full-length capacitors 680a-680d can detect a deformation that occurs along the respective lateral position of the respective full-length capacitors 680a-680d. Vertically aligned full-length capacitors 680a, 680c as well as vertically aligned full-length capacitors 680b, 680d can be analyzed together to detect direction of bending.

Figure 7:
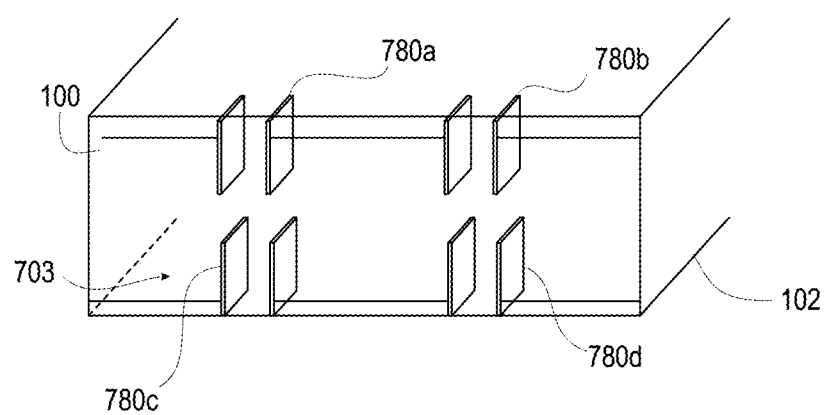
FIG. 7 is a three-dimensional view of an example communication device with a force sensor having two short capacitors positioned on one edge of top area of a housing and respectively aligned with two short capacitors positioned on one edge of a bottom area of the housing, according to one or more embodiments.

FIG. 7 is a three-dimensional view of example communication device 100 with force sensor 703 having four short capacitors 780a-780d. Two short capacitors 780a-780b positioned on one edge of top area of housing 102. Two short capacitors 780c-780d are positioned on one edge of a bottom area of housing 102 and aligned respectively with short capacitors 780a-780d. Short capacitors 780a-780d can be monitored to detect forces that specifically affect one edge of communication device 100.

Figure 8A:
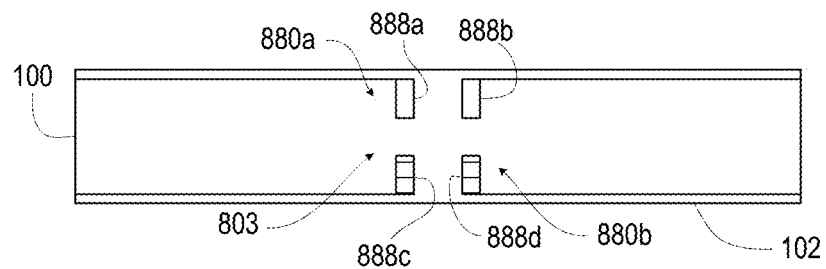
FIG. 8A is a side view of a force sensor of the example communication device of FIG. 1, according to one or more embodiments.

FIG. 8A is a side view of force sensor 803 of example communication device 100 of FIG. 1. Housing 102 is in a relaxed, normal position. Force sensor 803 has upper capacitor 880a across a top area of housing 102 aligned with lower capacitor 880b across a bottom area of housing 102. Upper capacitor 880a has upper paired conductive plates 888a-888b that are parallel and have respective inward faces aligned, each perpendicular to a closest upper rectilinear face of housing 102. Force sensor 803 includes lower capacitor 880*b* having lower paired conductive plate 888*c*-888*d* that are parallel and have respective inward faces aligned, each perpendicular to a closest lower rectilinear face of housing 102. Conductive plate 888*c* is the positive terminal and conductive plate 888*d* is the negative terminal.

Figure 8B:
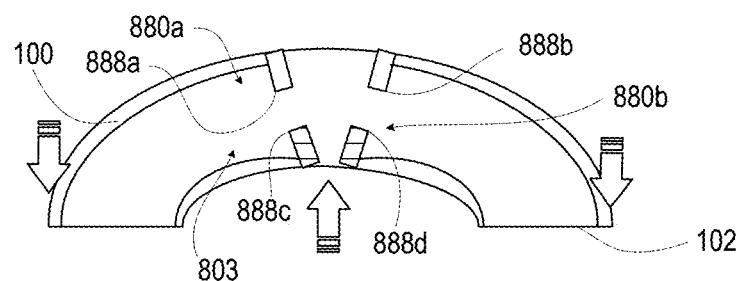
FIG. 8B is a side view of a force sensor of the communication device of FIG. 8A having planar aligned top and bottom capacitors that are bent in a first direction, according to one or more embodiments.
Figure 8C:
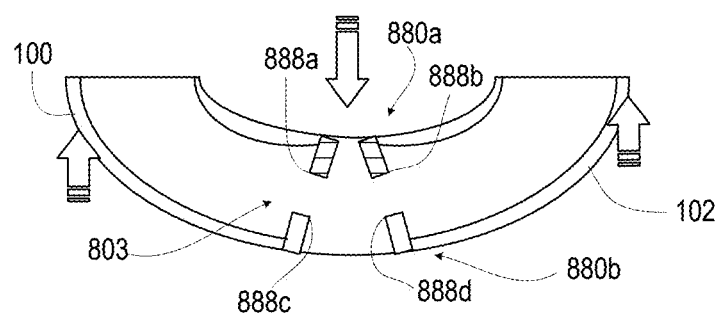
FIG. 8C is a side view of the force sensor of the communication device of FIG. 8A that is bent in a second direction opposite to the first direction, according to one or more embodiments.

FIG. 8B is a side view of force sensor 803 of communication device 100 of FIG. 8A. Force sensor 803 has planar aligned top and bottom capacitors 880*a*-880*b*. Housing 102 is bent in a first direction (outer ends downward as depicted), lengthening a top surface and top capacitor 880*a* and compressing a bottom surface and bottom capacitor 880*b*. Upper paired conductive plates 888*a*-888*b* of top capacitor 880*a* move farther apart, reducing capacitance of upper capacitor 880*a*. Lower paired conductive plates 888*a*-888*b* of bottom capacitor 880*b* move closer together, increasing capacitance of lower capacitor 380*b*. The respective changes in capacitance indicates the direction as well as the magnitude of bending. FIG. 8C is a side view of force sensor 803 of communication device 100 of FIG. 8A that is bent in a second direction opposite to the first direction (outer ends upward as depicted). Upper paired conductive plates 888*a*-888*b* move closer together, increasing capacitance of upper capacitor 880*a*. Lower paired conductive plates 888*a*-888*b* move farther apart, decreasing capacitance of lower capacitor 380*b*. The respective changes in capacitance indicates the direction and magnitude of bending.

Figure 9:
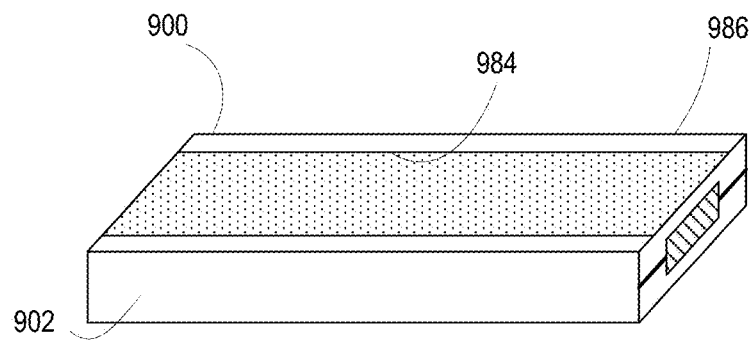
FIG. 9 is a three-dimensional view of an example communication device having a cover, according to one or more embodiments.

FIG. 9 is a three-dimensional view of example communication device 900 having housing 902 that includes frame 984 that fully encloses functional components 195 (FIG. 1) and that receives and is partially encompassed by engageable cover 986. Cover 986 can be attached to frame 184 during manufacturing or can be a replaceable component that engages and disengages frame 984. For example, cover 986 frictionally engages frame 184. Cover 986 can be a shell, presenting internal air spaces between cover 986 and frame 984.

Figure 10:
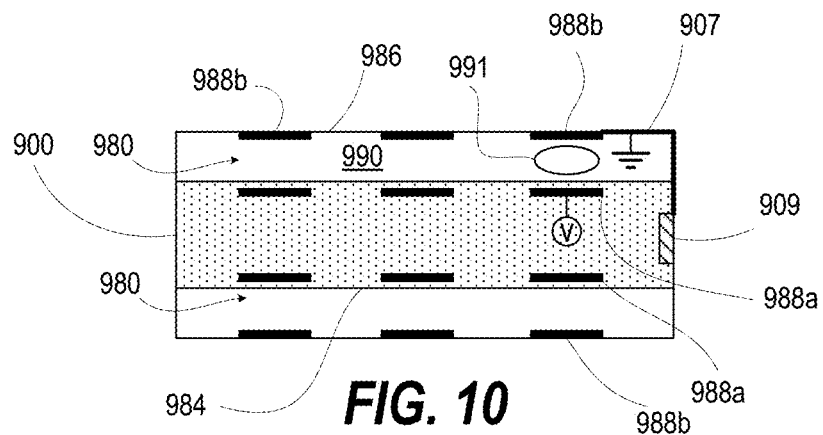
FIG. 10 is a top view of an example communication device of FIG. 9 having electrically grounded outer capacitive plates, according to one or more embodiments.

FIG. 10 is a top view of example communication device 900 of FIG. 9 having force sensor 1003 that includes outer conductive plates 988*b* electrically grounded by conduction path 907 to grounded port 909. Engageable cover 986 is formed of dielectric material 990 that can include air spaces 991. Portions of frame 984 can be metallic, serving as a second conductive plate 988*a* of each capacitor 980. Pressure exerted by an object or a person is not required to contribute electrically to the functioning of each capacitor 980. The object or person causes deformation that results in a change in capacitance of capacitor 980. The source of the pressure but does not provide electrical charge or otherwise act as a conductor. In one or more embodiments, the object or person acts on dielectric material and does not touch capacitors 980. Similar to the force sensors described above, the user provides a mechanical force that causes a deformation. Polarization is provided by capacitor driver 182*a*-182*e* (FIG. 1). In one or more embodiments, conductive plates 988*a* (positive terminal) are inside of or on housing frame 984 and conductive plates 988*b* (negative terminals) are in engageable cover 986, which functions as a dock/holster around housing frame 984. Conductive plates 988*b* (negative terminals) are located in engageable cover 986, where conductive plates 988*b* can move toward conductive plates 988*a* (positive terminal) inside of or on housing frame 984. Squeezing engageable cover 986 changes the capacitance value of capacitors 980.

Figure 11:
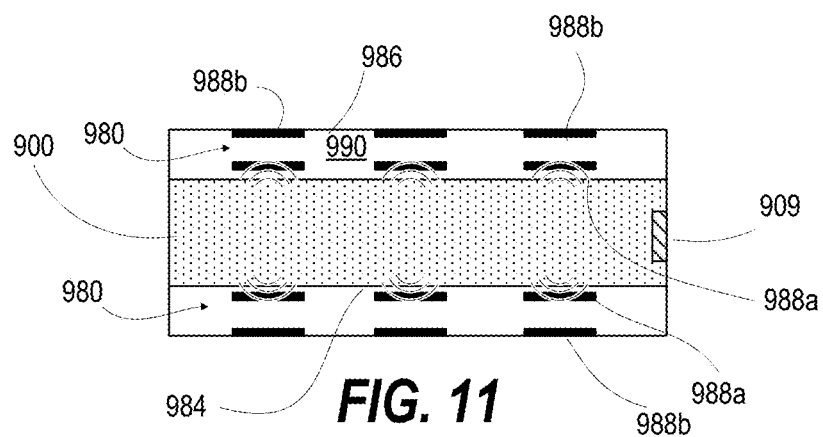
FIG. 11 is a top view of an example communication device of FIG. 9 having outer capacitive plates that are not electrically grounded, according to one or more embodiments.

FIG. 11 is a top view of an alternate example of communication device 900 of FIG. 9 having force sensor 1103 that includes electrically ungrounded outer capacitive plates 988*a* embedded in engageable cover 986. In one or more embodiments, inner conductive plates 988*b* are inductively coupled to frame 984 and embedded in engageable cover 986. In one or more alternate embodiments, self-contained electronics in engageable cover 986 transmits the resulting deformation information to communication device 900. For example, force sensor 1103 uses wireless protocols that may include Bluetooth Low Energy (BLE) or by physical connection, such as via universal serial bus (USB). In one or more embodiments, engageable cover 986 is rigid, such as being formed of a hard plastic. Conductive plates 988*b* (negative terminals) are attached externally on engageable cover 986. When touched by user, conductive plates 988*b* (negative terminals) are grounded by user, changing the electrical charge on conductive plates 988*b*, and thus changes capacitance between conductive plates 988*a*-988*b*. Without user touch, capacitance conductive plates 988*b* are floating (i.e., not electrically connected to grounded components of communication device 900) and capacitance of capacitors 980 does not change.

Figure 12:
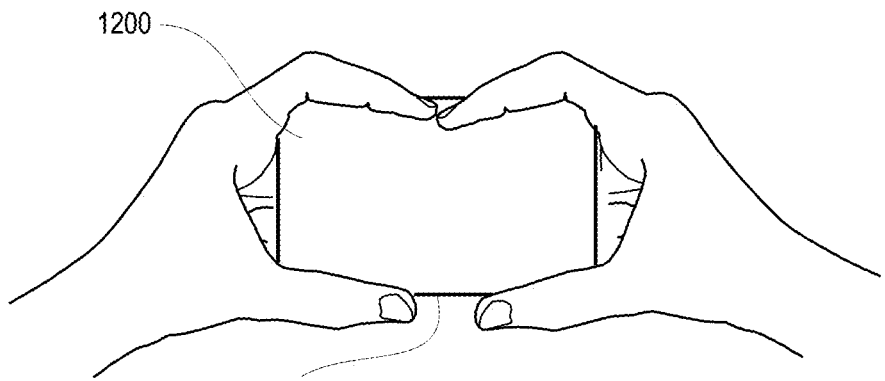
FIG. 12 is a front view of an example communication device with a capacitive-based force sensing cover that is being manipulated, according to one or more embodiments.
Figure 13:
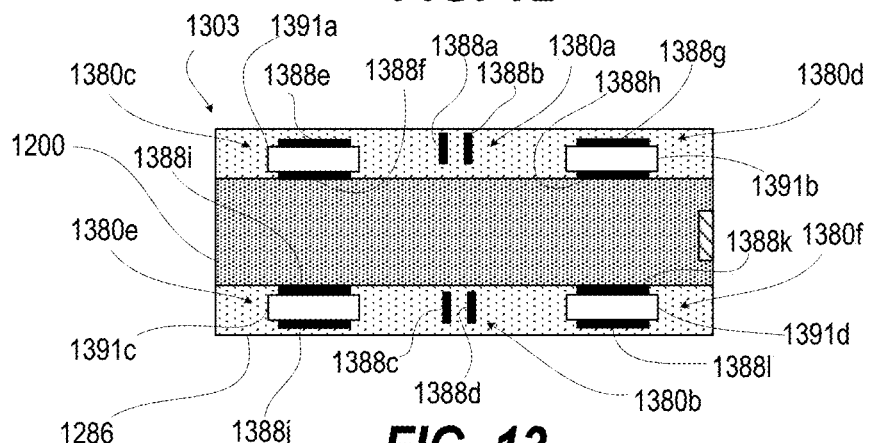
FIG. 13 is a front cross-sectional view of the example communication device of FIG. 12 in a relaxed, normal state, according to one or more embodiments.

FIG. 12 is a front view of example communication device 1200 with CBFS cover 1286 that is being manipulated by bending and twisting. FIG. 13 is a front cross-sectional view of example communication device 1200 of FIG. 12 in a relaxed, normal state. Force sensor 1303 has capacitors 1380*a*-1380*f* embedded in CBFS cover 1286. Capacitors 1380*a*-1380*f* are respectively oriented to detect forces on housing 1302 that are applied at different locations and directions. First capacitor 1380*a* is positioned in a top center area of CBFS cover 1286 aligned with second capacitor 1380*b* in a bottom center area of housing 1302. First capacitor 1380*a* has upper paired conductive plates 1388*a*-1388*b*. Conductive plates 1388*a*-1388*b* are parallel and have respective inward faces aligned. Conductive plates 1388*a*-1388*b* are each perpendicular to a closest upper rectilinear face of housing 1302. Second capacitor 1380*b* has lower paired conductive plates 1388*c*-1388*d*. Conductive plates 1388*c*-1388*d* are parallel and have respective inward faces aligned. Conductive plate 1388*c* is the positive terminal and conductive plate 1388*d* is the negative terminal. Conductive plates 1388*c*-1388*d* are each perpendicular to a closest lower rectilinear face of housing 1302. Third capacitor 1380*c* is in a left top corner of CBFS cover 1286 and includes horizontal top and bottom conductive plates 1388*e*-1388*f* separated by air space 1391*a*. Conductive plate 1388*e* is the positive terminal and conductive plate 1388*f* is the negative terminal. Fourth capacitor 1380*d* is in a right top corner of CBFS cover 1286 and includes horizontal top and bottom conductive plates 1388*g*-1388*h* separated by air space 1391*b*. Conductive plate 1388*g* is the positive terminal and conductive plate 1388*h* is the negative terminal. Fifth capacitor 1380*e* is in a left bottom corner of CBFS cover 1286 and includes horizontal top and bottom conductive plates 1388*i*-1388*j* separated by air space 1391*c*. Conductive plate 1388*i* is the positive terminal and conductive plate 1388*j* is the negative terminal. Sixth capacitor 1380*f* is in a right bottom corner of CBFS cover 1286 and includes horizontal top and bottom conductive plates 1388*k*-1388*l* separated by air space 1391*d*. Conductive plate 1388*k* is the positive terminal and conductive plate 1388*l* is the negative terminal.

Figure 14:
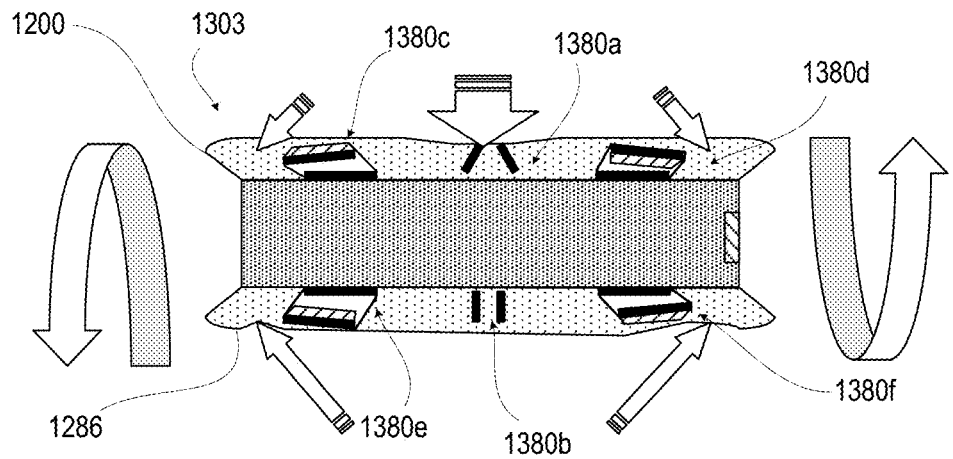
FIG. 14 is a front cross-sectional view of the example communication device of FIG. 12 in a deformed state due to one or more of twisting, shearing, and bending, according to one or more embodiments.

FIG. 14 is a front cross-sectional view of example communication device 1300 of FIG. 13 with CBFS cover 1286 in a deformed state due to twisting, shearing, and bending. These forces alter the capacitance of capacitors 1380*a*-1380*f* of force sensor 1303. In one or more embodiments, the particular combination of motions can be associated with the respective changes in capacitance using machine learning or programming. For example, a user can be prompted to perform a certain manipulation. As another example, a user can define a certain manipulation that is intended to be associated with a particular user input. Communication device 1300 associates the resulting changes in capacitance to the solicited or defined manipulations, setting thresholds for future detection based on the changing capacitances.

Figure 15A:
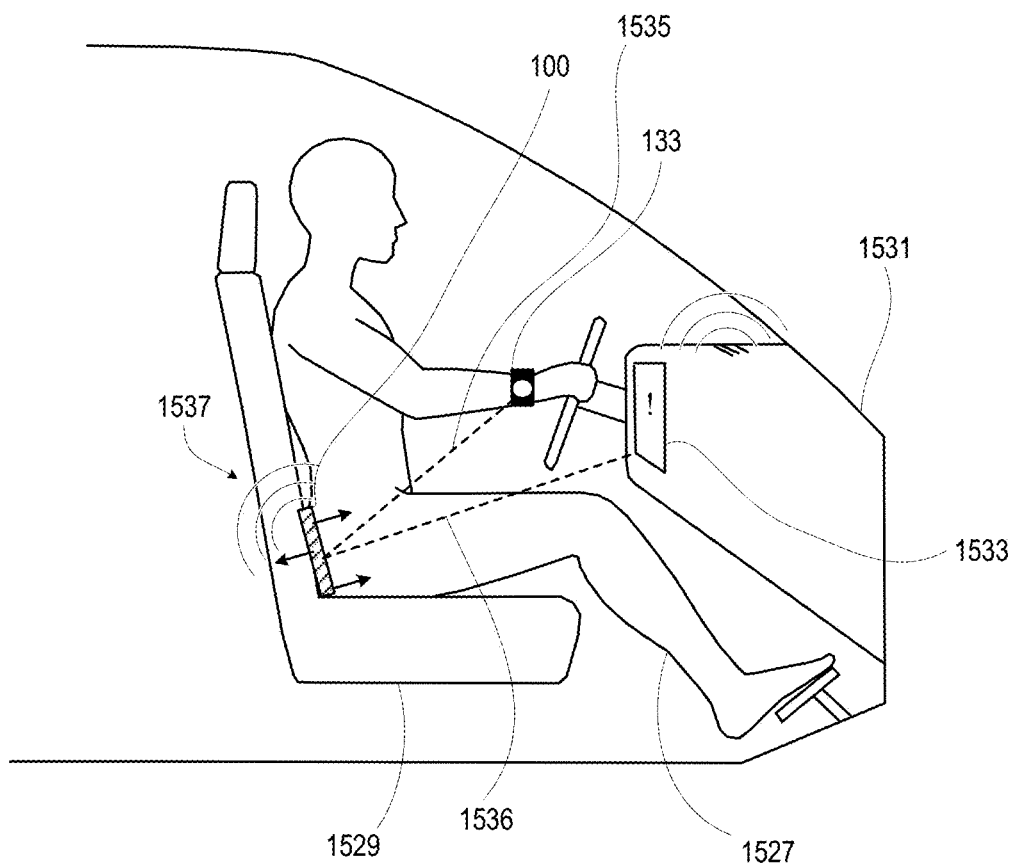
FIG. 15A is a side view of communication device of FIG. 1 locally responding to an inadvertent force on the device that could cause structural damage, according to one or more embodiments.

FIG. 15A is a side view of communication device 100 responding to an inadvertent mechanical force such as bending that could cause structural damage. Communication device 100 is stowed in a rear pant pocket of user 1527 or otherwise positioned under user 1527 against driver seat 1529 of vehicle 1531. Forces on communication device 100 are automatically detected and determined by controller 101 (FIG. 1) to be at or beyond a preset threshold for posing a risk of damage to communication device 100. The measurement of forces can be specific to a structural strength of communication device 100 to a force at a specific location and in a specific direction. For example, a longer longitudinal dimension of communication device 100 can serve as a longer lever having greater mechanical advantage for causing damage as compared to a shorter lateral dimension. As another example, a pivoting connection can be structurally weaker than a non-pivoting portion. Communication device 100 attempts to alert user 1527 by generating one or more notifications. In one or more embodiments, the notification includes wireless alerts 1535-1536 respectively to another user interface device, such as smart phone 133 or vehicle user interface device 1533. In one or more embodiments, the notification includes an audio output 1537. In one or more embodiments, a visual indication can also be provided, such as break alert 152*a* (FIG. 1), which could be visible if user 1527 was manipulating communication device 100.

Figure 15B:
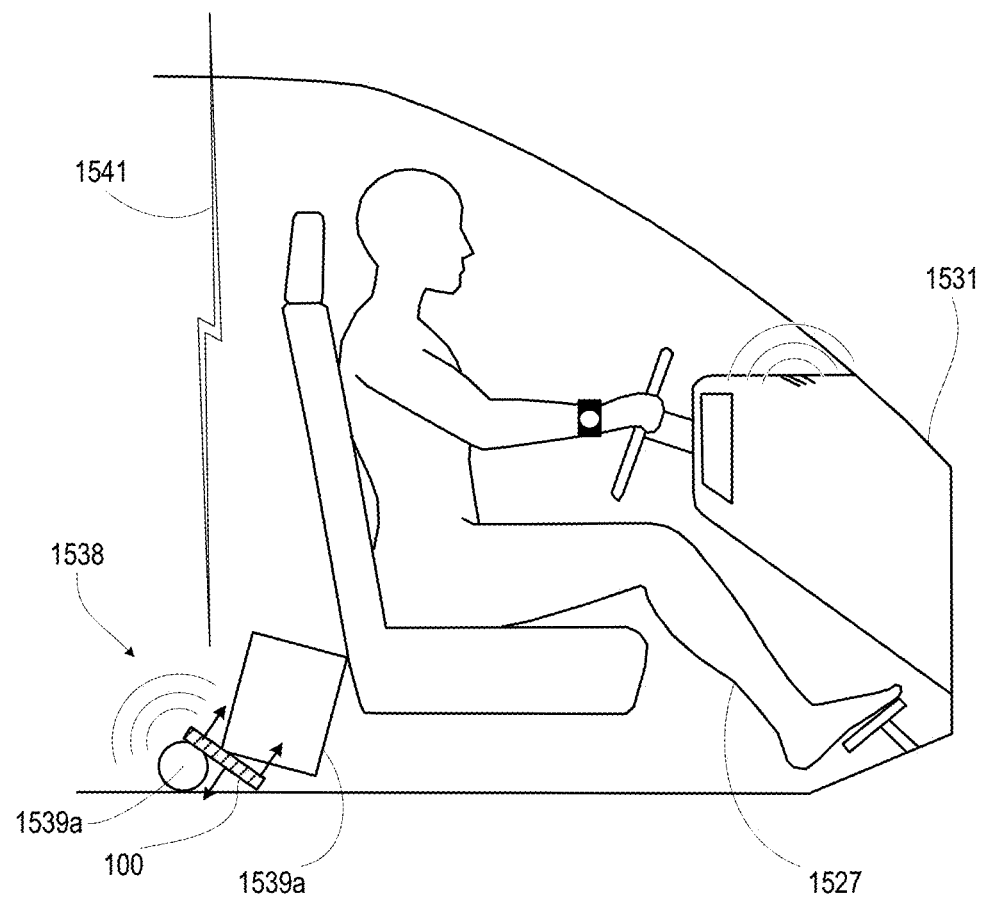
FIG. 15B is a side view of communication device of FIG. 1 remotely responding to an inadvertent force on the device that could cause structural damage, according to one or more embodiments.

FIG. 15B is a side view of communication device 100 responding to another inadvertent mechanical force such as bending that could cause structural damage. Communication device 100 is out of range of an associated owner but was left behind in vehicle 1531. Communication device 100 detects mechanical forces due to inanimate objects 1539*a*-1539*b*. With this example scenario, communication device 100 is not paired or synchronized with user interface devices (133, 1533) within vehicle 1531. In response to the specific type of and/or the magnitude of mechanical force, and based on a pre-configuration or setting of the device, communication device 100 generates a notification of audio output 1538. Depending on the specific scenario and the pre-configuration of the device and/or the device setting for responding to detection of mechanical forced above a pre-established threshold, audio output 1538 may not be heard by user 1527. For example, the distance or sound muffling items between communication device 100 and user 1527 sufficiently attenuates audio output 1538 so as to be inaudible to user 1527 over other noises. Communication device 100 also generates a notification that is sent by OTA or wireless uplink channel 1541 to base node 127 (FIG. 1).

Figure 16:
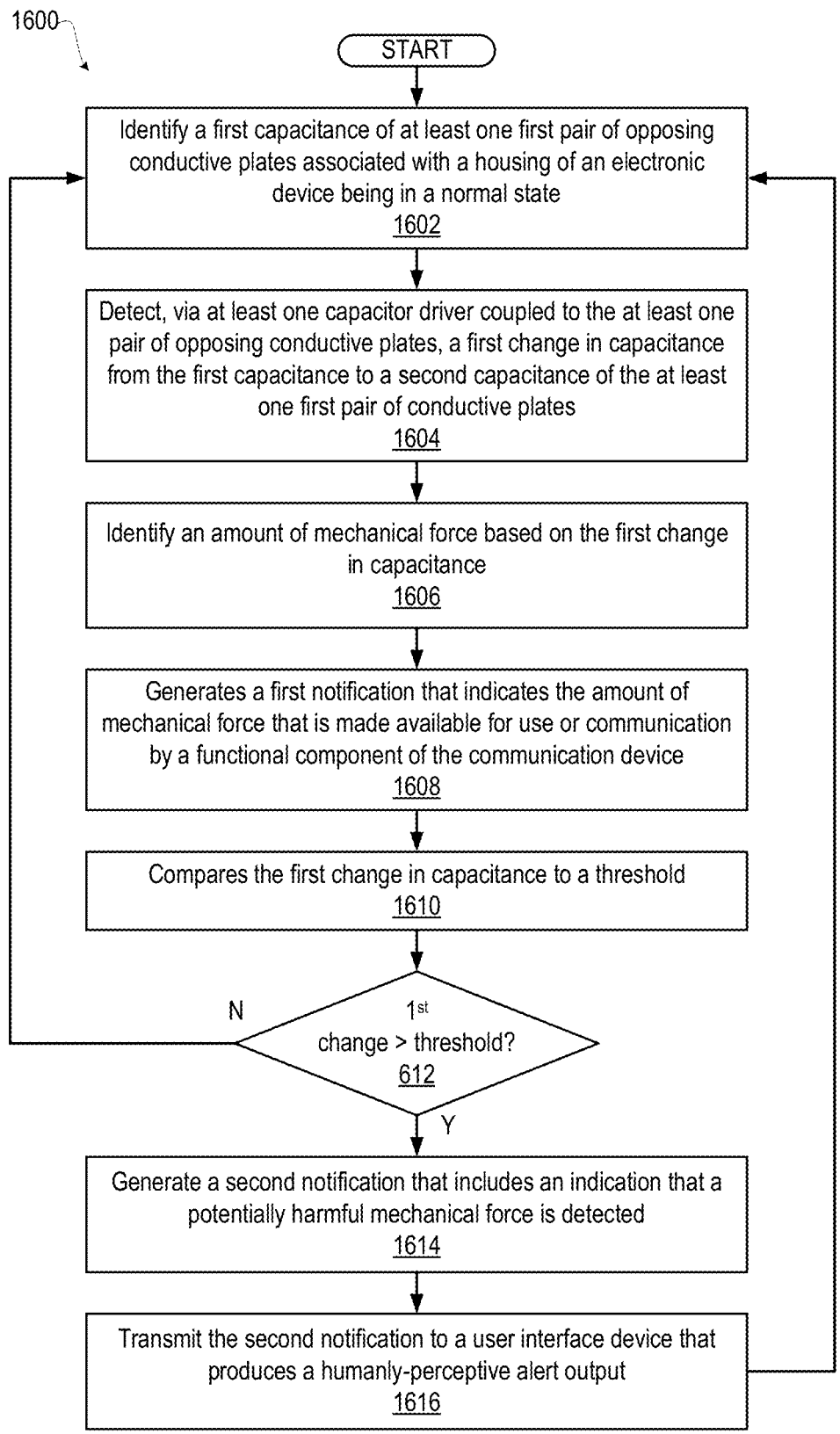
FIG. 16 depicts a flow diagram of a method for capacitive-based force sensing by an electronic device to generate force measurements and alerts of risk of damage, according to one or more embodiments.

FIG. 16 presents a flow diagram of method 1600 for capacitive-based force sensing by an electronic device to perform force measurements and generate alerts of risk of damage due to detected forces. The description of method 1600 is provided with general reference to the specific components illustrated within the preceding FIGS. 1-15. In at least one embodiment, certain aspects of method 1600 can be performed by force sensor(s) (103, 203, 303, 403, 503, 603, 703, 803, and 1303) of communication device 100, managed by controller 101 (FIG. 1). Specific components described in method 1600 can be identical or similar to specific components of the same name used to describe preceding FIGS. 1-15. With reference to FIG. 16, method 1600 includes identifying a first capacitance of at least one first pair of conductive plates associated with a housing of an electronic device (block 1602). The first capacitance is associated with the housing being in a normal state. The at least one first pair of conductive plates is coupled to the housing. The conductive plates are electrically isolated by a dielectric material. The at least one first pair of conductive plates is positioned such that the conductive plates change relative orientation in relation to deformation of the housing that results from mechanical forces. Method 1600 includes detecting, via at least one capacitor driver coupled to the at least one pair of conductive plates, a first change in capacitance of the at least one first pair of conductive plates from the first capacitance to a second capacitance (block 1604). Method 1600 includes identifying an amount of mechanical force based on the first change in capacitance (block 1606). Method 1600 includes generating a first notification that indicates the amount of mechanical force (block 1608). In one or more embodiments, the first notification includes a location and direction of the mechanical force associated with the at least one first pair of conductive plates. In one or more embodiment, the first notification is directed to, or is made available in commonly accessed device memory, for use by a functional component of the communication device or for communication to a remote entity. Method 1600 includes comparing the first change in capacitance to a threshold (block 1610). In one or more embodiments, the threshold is set to reduce a likelihood of a false positive for a Boolean On/Off type user input. In one or more embodiments, the threshold is one of many sequential thresholds that converts the capacitance to a range of discrete values. In one or more embodiments, the threshold is an analog to digital conversion of a continuously varying user input. A determination is made, in decision block 1612, whether the first change exceeds the threshold. In response to determining that the first change exceeds the threshold, method 1600 includes generating a second notification that includes an indication that a potentially harmful mechanical force is detected (block 1614). Method 1600 includes transmitting the second notification to a user interface device that produces a humanly-perceptible alert output (block 1616). Then method 1600 returns to block 1602. In response to determining that the first change does not exceed the threshold, method 1600 returns to block 1602.

Figure 17A:
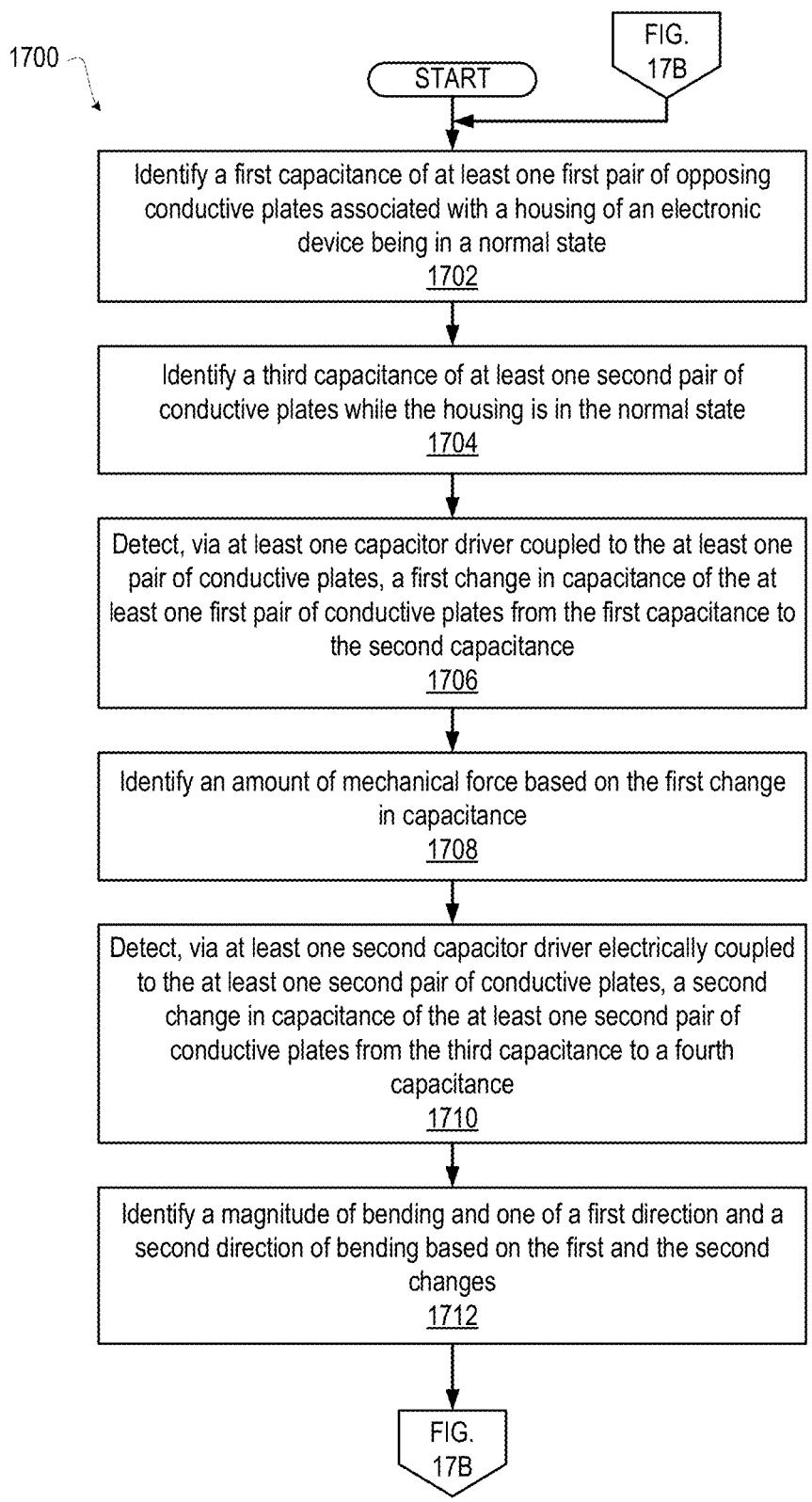
FIGS. 17A-17B (FIG. 17) depict a flow diagram of a method for capacitive-based force sensing by an electronic device to detect bending, according to one or more embodiments.
Figure 17B:
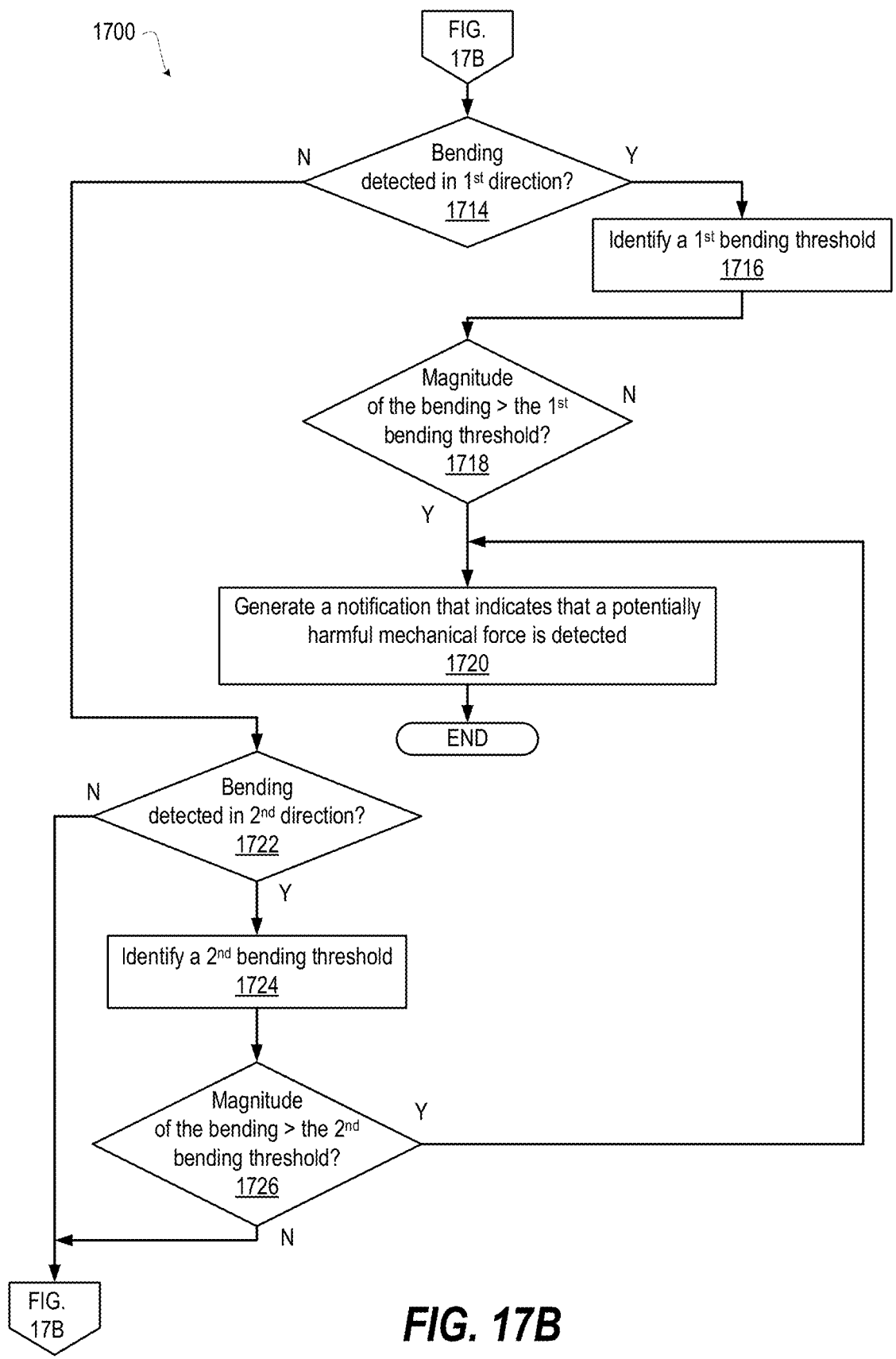

FIGS. 17A-17B (FIG. 17) present a flow diagram of method 1700 for capacitive-based force sensing by an electronic device to detect bending. The description of method 1700 is provided with general reference to the specific components illustrated within the preceding FIGS. 1-16. In at least one embodiment, certain aspects of method 1700 can be performed by force sensor(s) (103, 203, 303, 403, 503, 603, 703, 803, and 1303) of communication device 100, managed by controller 101 (FIG. 1). Specific components described in method 1700 can be identical or similar to specific components of the same name used to describe preceding FIGS. 1-16. With reference to FIG. 17A, method 1700 includes identifying a first capacitance of at least one first pair of conductive plates associated with a housing of an electronic device (block 1702). The first capacitance is associated with the housing being in a normal state. The at least one first pair of conductive plates is coupled to the housing. The conductive plates are electrically isolated by a dielectric material. The at least one first pair of conductive plates is positioned such that the conductive plates change relative orientation, and thus capacitance to a second capacitance, in relation to deformation of the housing that results from mechanical forces. Method 1700 includes identifying a third capacitance of at least one second pair of conductive plates while the housing is in the normal state (block 1704). The at least one second pair of conductive plates is coupled to an opposite side of the housing, and in planar alignment with, the at least one first pair of conductive plates. The at least one second pair of conductive plates is electrically isolated by a dielectric material. The at least one second pair of conductive plates is positioned to change relative orientation of the plates, and thus capacitance to a fourth capacitance, in relation to bending of the housing. Method 1700 includes detecting, via at least one capacitor driver coupled to the at least one pair of conductive plates, a first change in capacitance of the at least one first pair of conductive plates from the first capacitance to the second capacitance (block 1706). Method 1700 includes identifying an amount of mechanical force based on the first change in capacitance (block 1708). Method 1700 includes detecting, via at least one second capacitor driver electrically coupled to the at least one second pair of conductive plates, a second change in capacitance of the at least one second pair of conductive plates from the third capacitance to a fourth capacitance (block 1710). Method 1700 includes identifying a magnitude of bending and one of a first direction and a second direction of bending based on the first and the second changes (block 712).

With reference to FIG. 17B, a determination is made, in decision block 1714 whether bending is detected in the first direction. In response to determining that bending is detected in the first direction, method 1700 includes identifying a first bending threshold (block 1716). A determination is made, in decision block 1718, whether magnitude of the bending is greater than the first bending threshold. In response to determining that the bending is greater than the first bending threshold, method 1700 includes generating a notification that indicates that a potentially harmful mechanical force is detected (block 1720). Then method 1700 ends. In response to determining that bending is not detected in the first direction, method 1700 includes identifying a second bending threshold (block 1722). The second bending threshold can be different from the first bending threshold. A determination is made, in decision block 1724 whether magnitude of the bending is greater than the second bending threshold. In response to determining that the bending is greater than the second bending threshold, method 1700 returns to block 1720. In response to determining that bending is not detected in the second direction, method 1700 returns to 1702 (FIG. 1).

In one or more embodiments, the housing comprises a base portion, a flip portion, and a pivot portion pivotally coupling the base portion to the flip portion to move between a closed position and an open position. The at least one first pair of conductive plates is positioned to detect deformation of the pivot portion beyond the open position.

In the above described flow charts presented herein, certain steps of the methods can be combined, performed simultaneously or in a different order, or perhaps omitted, without deviating from the spirit and scope of the described innovation. While the method steps are described and illustrated in a particular sequence, use of a specific sequence of steps is not meant to imply any limitations on the innovation. Changes may be made with regards to the sequence of steps without departing from the spirit or scope of the present innovation. Use of a particular sequence is therefore, not to be taken in a limiting sense, and the scope of the present innovation is defined only by the appended claims.

Aspects of the present innovation are described above with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

While the innovation has been described with reference to exemplary embodiments, it will be understood by those skilled in the art that various changes may be made, and equivalents may be substituted for elements thereof without departing from the scope of the innovation. In addition, many modifications may be made to adapt a particular system, device or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description but is not intended to be exhaustive or limited to the innovation in the form disclosed. Many modifications and variations will be apparent to those of ordinary skill in the art without departing from the scope and spirit of the innovation. The embodiments were chosen and described in order to best explain the principles of the innovation and the practical application, and to enable others of ordinary skill in the art to understand the innovation for various embodiments with various modifications as are suited to the particular use contemplated.

What is claimed is:

1. An electronic device comprising:
a housing;
a plurality of pairs of conductive plates positioned along external edges of the housing, the plurality of pairs comprising at least one first pair of conductive plates coupled to the housing and electrically isolated by a dielectric material, the at least one first pair of conductive plates positioned to change relative orientation in relation to mechanical force that deforms the housing, the mechanical force being one or more of a torsion/twisting, a bending, a shearing, a compression, or a tension force, the plurality of pairs of conductive plates providing a longitudinal force sensor positioned to detect forces that deform a long axis of the housing, a lateral force sensor positioned to detect forces that deform a shorter, lateral axis of the housing, and an angled force sensor that is transverse to both the longitudinal and the lateral axes of the electronic device and detects a force exerted on a corner of the housing;
at least one capacitive driver electrically coupled to each of the plurality of pairs of conductive plates, including the at least one pair of conductive plates;
a controller communicatively coupled to the at least one capacitive driver, and which:
identifies a first capacitance of each of the plurality of pairs of conductive plates associated with the housing being in a normal state;
detects, via the at least one capacitor driver, a first change in capacitance from the first capacitance to a second capacitance of at least one first pair of conductive plates;
identifies an amount of mechanical force based on the first change in capacitance;
generates a first notification that indicates the amount and direction of mechanical force;
compares the first change in capacitance to a threshold; and
in response to the first change exceeding the threshold, generates a second notification that includes an indication that a potentially harmful mechanical force is detected.

2. The electronic device of claim 1, further comprising a user interface device communicatively coupled to the controller, wherein the controller transmits the notification to the user interface device, which presents an indication that a potentially harmful mechanical force is detected.

3. The electronic device of claim 1, wherein the dielectric material comprises a malleable material that is deformed by a mechanical shear force that imparts a change in one of relative distance and alignment of each conductive plate of at least the first pair of conductive plates, each conductive plate having a rigid structure that maintains dimensional integrity when deformation of the malleable material occurs.

4. The electronic device of claim 1, wherein the housing comprises a housing skin attached to a frame, each conductive plate of the at least first pair of conductive plates are respectively attached to the housing skin and the frame, wherein the dielectric material comprises an air space between the housing skin and the frame.

5. The electronic device of claim 1, further comprising:
a housing skin attached to the frame; and
a protective cover received on the housing skin and that comprises at least one conductive plate of each one of the at least the first and the second pairs of conductive plates.

6. The electronic device of claim 1, further comprising:
at least one second pair of conductive plates coupled to an opposite side of the housing to the at least one first pair of conductive plates, the at least one second pair of conductive plates electrically isolated by a dielectric material, the at least one second pair of conductive plates positioned to change relative orientation in relation to bending of the housing;
at least one second capacitive driver electrically coupled to the at least one second pair of conductive plates, wherein:
the controller is communicatively coupled to the at least one second capacitive driver, and the controller:
identifies a third capacitance of the at least one second pair of conductive plates with the housing being in normal state;
detects, via the at least one second capacitor driver, a second change in capacitance from the third capacitance to a fourth capacitance of the at least one second pair of conductive plates;
identifies one of a first direction and a second direction of bending based on the first and the second changes; and
associates the threshold with the identified one of the first and the second direction of bending.

7. The electronic device of claim 1, wherein:
the housing comprises a base portion, a flip portion, and a pivot portion pivotally coupling the base portion to the flip portion to move between a closed position and an open position; and
the at least one first pair of conductive plates is positioned to detect deformation of the pivot portion beyond the open position.

8. The electronic device of claim 1, further comprising:
a user interface device communicatively coupled to the controller;
at least one second pair of conductive plates comprises more than one pair of conductive plates physically aligned to detect the mechanical force at corresponding points on the housing;
the at least one capacitive driver comprises more than one capacitive drivers that are respectively electrically coupled to different pairs of conductive plates; and the controller:
associates capacitance received from each one of the more than one capacitor drivers with a corresponding section of the housing;
generates a second notification of a first user input to the user interface device in response to detecting mechanical force exerted at a first point of more than one point; and
generates a third notification of a second user input to the user interface device in response to detecting mechanical force exerted at a second point of the more than one point.

9. The electronic device of claim 8, wherein:
the at least one first pair of the more than one pairs of conductive plates comprises at least two pairs of conductive plates oriented in different planes to detect different deflection types in the housing, the different deflection types being two or more deflection types from among compression, tension, shearing, bending, and torsion; and
the controller comprises a machine learning engine that associates a user input to a respective change in capacitance of the different pairs of conductive plates.

10. A method comprising:

identifying a first capacitance of at least one first pair of conductive plates of a plurality of pairs of conductive plates associated with a housing of an electronic device being in a normal state, the at least one first pair of conductive plates coupled to the housing and electrically isolated by a dielectric material, each of plurality of pairs of conductive plates, including the at least one first pair of conductive plates positioned to change relative orientation in relation to mechanical force that deforms the housing, the mechanical force being one or more of a torsion, a bending, a shearing, a compression, or a tension force, the plurality of pairs of conductive plates providing a longitudinal force sensor positioned to detect forces that deform a long axis of the housing, a lateral force sensor positioned to detect forces that deform a shorter, lateral axis of the housing, and an angled force sensor that is transverse to both the longitudinal and the lateral axes of the electronic device and detects a force exerted on a corner of the housing;

detecting, via at least one capacitor driver coupled to the at least one pair of conductive plates, a first change in capacitance from the first capacitance to a second capacitance of the at least one first pair of conductive plates;

identifying an amount of mechanical force based on the first change in capacitance;

generating a first notification that indicates the amount of mechanical force;

comparing the first change in capacitance to a threshold; and in response to the first change exceeding the threshold, generating a second notification that includes an indication that a potentially harmful mechanical force is detected.

11. The method of claim 10, further comprising:

transmitting the second notification to a user interface device that produces a humanly-perceptible alert output; and presenting, on the user interface device, an indication that a potentially harmful mechanical force is detected.

12. The method of claim 10, further comprising:

identifying a third capacitance of at least one second pair of conductive plates with the housing being in normal state, the at least one second pair of conductive plates coupled to an opposite side of the housing to the at least one first pair of conductive plates, the at least one second pair of conductive plates electrically isolated by a dielectric material, the at least one second pair of conductive plates positioned to change relative orientation in relation to bending of the housing;

detecting, via at least one second capacitor driver electrically coupled to the at least one second pair of conductive plates, a second change in capacitance from the third capacitance to a fourth capacitance of the at least one second pair of conductive plates; and identifying one of a first direction and a second direction of bending based on the first and the second changes; and associating the threshold with the identified one of the first and the second direction of bending.

13. The method of claim 10, wherein:

the housing comprises a base portion, a flip portion, and a pivot portion pivotally coupling the base portion to the flip portion to move between a closed position and an open position; and the at least one first pair of conductive plates is positioned to detect deformation of the pivot portion beyond the open position.

14. The method of claim 10, further comprising:

associating capacitance received from each one of more than one capacitor drivers with a corresponding section of the housing, the at least one second pair of conductive plates comprises more than one pair of conductive plates physically aligned to detect the mechanical force at corresponding points on the housing, the more than one capacitive drivers are respectively electrically coupled to different pairs of conductive plates;

associating a user input to a respective change in capacitance of different pairs of conductive plates having conductive plates oriented in different planes to detect different deflection types in the housing, the different deflection types being two or more deflection types from among compression, tension, shearing, bending, and torsion;

generating a second notification of a first user input to a user interface device in response to detecting mechanical force exerted at a first point of more than one point; and generating a third notification of a second user input to the user interface device in response to detecting mechanical force exerted at a second point of the more than one point.

15. A computer program product comprising:

a non-transitory computer readable storage device; and program code on the non-transitory computer readable storage device that when executed by a processor associated with a communication device, the program code enables the communication device to provide functionality of:

identifying a first capacitance of at least one first pair of conductive plates of a plurality of pairs of conductive plates associated with a housing of an electronic device being in a normal state, the at least one first pair of conductive plates coupled to the housing and electrically isolated by a dielectric material, each of plurality of pairs of conductive plates, including the at least one first pair of conductive plates positioned to change relative orientation in relation to mechanical force that deforms the housing, the mechanical force being one or more of a torsion, a bending, a shearing, a compression, or a tension force, the plurality of pairs of conductive plates providing a longitudinal force sensor positioned to detect forces that deform a long axis of the housing, a lateral force sensor positioned to detect forces that deform a shorter, lateral axis of the housing, and an angled force sensor that is transverse to both the longitudinal and the lateral axes of the electronic device and detects a force exerted on a corner of the housing;

detecting, via at least one capacitor driver coupled to the at least one pair of conductive plates, a first change in capacitance from the first capacitance to a second capacitance of the at least one first pair of conductive plates;

identifying an amount of mechanical force based on the first change in capacitance;

generating a first notification that indicates the amount of mechanical force;

comparing the first change in capacitance to a threshold; and in response to the first change exceeding the threshold, generating a second notification that includes an indication that a potentially harmful mechanical force is detected.

16. The computer program product of claim 15, wherein the program code enables the communication device to provide the functionality of:

transmitting the notification to a user interface device; and presenting, on the user interface device, an indication that a potentially harmful mechanical force is detected.

17. The electronic device of claim 1, further comprising a communication subsystem communicatively coupled to the controller, wherein the controller transmits the second notification as a wireless alert via the communication subsystem to be presented on a second user interface device of a second device that is a paired or synchronized with the electronic device.

18. The electronic device of claim 1, further comprising a communication subsystem communicatively coupled to the controller, wherein the controller transmits the second notification as via an over the air or wireless uplink to a base node of an external communication system.

19. The method of claim 10, further comprising transmitting the second notification as a wireless alert via the communication subsystem to be presented on a second user interface device of a second device that is a paired or synchronized with the electronic device.

20. The computer program product of claim 15, wherein the program code enables the communication device to provide the functionality of transmitting the second notification as a wireless alert via the communication subsystem to be presented on a second user interface device of a second device that is a paired or synchronized with the electronic device.

* * * * *